(12) United States Patent
Jung et al.

(10) Patent No.: US 7,459,961 B2
(45) Date of Patent: Dec. 2, 2008

(54) VOLTAGE SUPPLY INSENSITIVE BIAS CIRCUITS

(75) Inventors: Sang Hwa Jung, Gojan-dong (KR); Jung-Hyun Kim, Ojeon-dong (KR); Moon-Suk Jeon, Kwanakgu (KR); Woo-Yeon Hong, Dong An-Gu (KR)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 101 days.

(21) Appl. No.: 11/590,674

(22) Filed: Oct. 31, 2006

(65) Prior Publication Data

US 2008/0116977 A1    May 22, 2008

(51) Int. Cl.
*G05F 1/10* (2006.01)

(52) U.S. Cl. .................. 327/538; 327/539; 323/311; 323/312

(58) Field of Classification Search .................. None
See application file for complete search history.

(56) References Cited

U.S. PATENT DOCUMENTS

| | | | |
|---|---|---|---|
| 3,809,928 A * | 5/1974 | Evans | 327/513 |
| 3,851,190 A * | 11/1974 | Hongu et al. | 327/333 |
| 5,084,665 A | 1/1992 | Dixon et al. | |
| 5,793,194 A | 8/1998 | Lewis | |
| 5,793,247 A | 8/1998 | McClure | |
| 5,825,236 A | 10/1998 | Seevinck et al. | |
| 6,114,901 A | 9/2000 | Singh et al. | |
| 6,441,687 B1 | 8/2002 | Apel | |
| 6,900,692 B2 | 5/2005 | Kim et al. | |
| 7,142,058 B2 * | 11/2006 | Bokatius | 330/289 |
| 2005/0068101 A1 | 3/2005 | Kim et al. | |
| 2005/0083117 A1 | 4/2005 | Kim et al. | |
| 2005/0099227 A1 | 5/2005 | Kim et al. | |
| 2005/0122165 A1 | 6/2005 | Kim et al. | |
| 2008/0116977 A1 * | 5/2008 | Jung et al. | 330/296 |

* cited by examiner

*Primary Examiner*—Tuan Lam
*Assistant Examiner*—Hiep Nguyen

(57) ABSTRACT

A voltage-insensitive circuit includes a second circuit, and a biasing means for providing a constant bias current to the second circuit, the bias current being insensitive to power fluctuations of the voltage-insensitive circuit.

11 Claims, 6 Drawing Sheets

VOLTAGE SUPPLY INSENSITIVE BIAS CIRCUITS

BACKGROUND

In various portable devices, such as cellular telephones, the need to provide stable DC operating conditions can be important. To obtain such stable DC operating conditions, a regulated voltage is often used. Such regulated voltages are useful to provide stable low noise amplifiers, variable gain amplifiers and power amplifiers.

Unfortunately, certain portable devices, such as cellular phones and PDAs, may use a battery as it sole power source. Because batteries do not provide constant voltages under varying conditions, electronic circuits that rely on stable DC voltages may perform poorly.

In order to compensate for this shortcoming, voltage regulating circuits, such as Low-DropOut regulators (LDOs) are used in conjunction with batteries. However, as the number of functions of portable devices (e.g., multimedia and camera) increase, the number of LDOs may also increase.

Unfortunately, the number of the LDOs available to a portable device may be limited due to area constraints. Thus, it is desirable to develop bias circuitry for amplifiers that can provide constant bias conditions over large battery voltage variations.

SUMMARY

In accordance with an exemplary embodiment, a voltage-insensitive bias circuit includes a first resistor connected between a power voltage node and a voltage divider node, a second resistor connected between a ground node and the voltage divider node, a first bipolar transistor having a first base, a first collector and a first emitter, a fourth resistor connected between the first base and the voltage divider node, a fifth resistor connected between the first collector and the power voltage node, a sixth resistor connected between the first emitter and the ground node, a second bipolar transistor having a second base, a second collector and a second emitter, wherein the second collector is connected to the power voltage node, a seventh resistor connected between the first collector and the second base and a second diode having a second anode and a second cathode, and a third diode having a third anode and a third cathode, wherein the second anode is connected to the second base, the second cathode is connected to the third anode, and the third cathode is connected to the ground node, wherein the second emitter provides a first bias output to a second circuit, the first bias output being appreciably insensitive to voltage fluctuations of the voltage power node.

In accordance with another exemplary embodiment, a voltage-insensitive bias circuit includes a first bipolar transistor having a first base, a first collector and a first emitter, wherein the first base is connected to a first reference node, the first collector is connected to a power voltage node and the first emitter provides a first bias output to a second circuit, the first bias output being appreciably insensitive to voltage fluctuations of the voltage power node, a reference resistor connected between the power voltage node and the first reference node, and a second bipolar transistor having a second base, a second collector and a second emitter, wherein the second base is connected to the first reference node, the second emitter is coupled to a ground node via a first diode and the second collector is coupled to a third transistor.

In accordance with yet another exemplary embodiment, a voltage-insensitive circuit includes a second circuit, and a biasing means for providing a constant bias current to the second circuit, the bias current being insensitive to power fluctuations of the voltage-insensitive circuit.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, specific details are set forth in order to provide a thorough understanding of example embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of hardware, software, firmware, materials and methods may be omitted so as to avoid obscuring the description of the illustrative embodiments. Nonetheless, such hardware, software, firmware, materials and methods that are within the purview of one of ordinary skill in the art may be used in accordance with the illustrative embodiments. Such hardware, software, firmware, materials and methods are clearly within the scope of the present teachings.

In many electronic devices, bias circuits are used to establish stable DC operating conditions. Additionally, bias circuits can compensate for process variations and temperature variations. While there are known bias circuits that can reduce an electronic device's sensitivity to supply voltage changes, they tend to fail with large battery voltage variations that often occur with portable devices. To address this, the developers of the disclosed methods and systems have devised a number of related solutions.

Note that in the following descriptions the terms "collector" and "emitter" are used for clarity of explanation. However, given that for many bipolar transistors there may be little or no substantial difference between the base and emitter, the terms may be considered as interchangeable or equivalents for certain transistors in the following descriptions unless otherwise stated.

Figure 1:
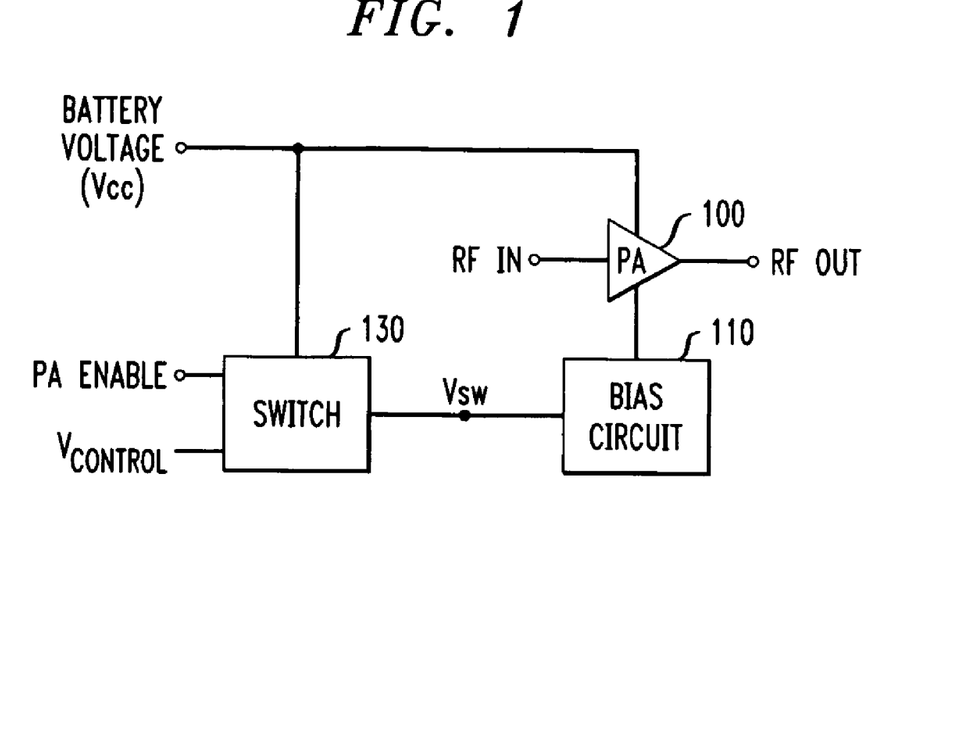
FIG. 1 is a block diagram of a power circuit using a power voltage insensitive circuit in accordance with an illustrative embodiment.

FIG. 1 is a block diagram of a power circuit using a power voltage insensitive circuit. As shown in FIG. 1, the power circuit includes a power amplifier 100 having an RFin and an RFout node, a bias circuit 110 and a bias modulation level switch 130.

In operation, the power amplifier 100 can amplify any number of signals received from its RFin node to produce an amplified signal at its RFout node. In order to stabilize the performance of the power amplifier 100 in lieu of fluctuations of the battery power supply Vcc feeding the power amplifier 100, the bias circuit 110 can use any of a number of special circuit arrangements as will be discussed below.

In various embodiments, the bias circuit 110 can not only provide a stable bias current for large power supply fluctuations, but it may also provide a stable bias current for substantial temperature variations.

Still further, in various embodiments where power may need to be conserved, the bias modulation level switch 130 may be used to change the bias current from an active level to a lower, power-conserving level.

Figure 2:
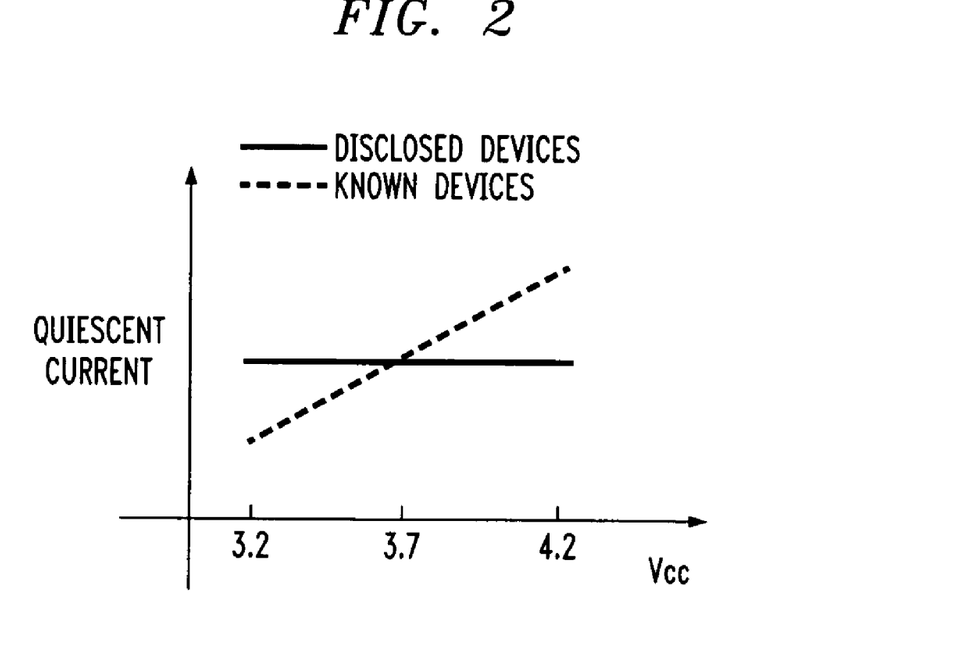
FIG. 2 is graph illustrating the relationship of bias currents and power fluctuations for various bias circuits in accordance with an illustrative embodiment.

FIG. 2 is graph illustrating the relationship of quiescent bias currents for a conventional bias circuit and the disclosed bias circuits for a voltage range of 3.7±0.5 volts. As shown in FIG. 1, the quiescent bias current for the conventional bias circuit can vary by an order of magnitude even for a single 1.0 volt change in power supply. In contrast, using the disclosed methods and devices (and careful component selection), quiescent bias currents can remain essentially flat for the same voltage range.

Figure 3:
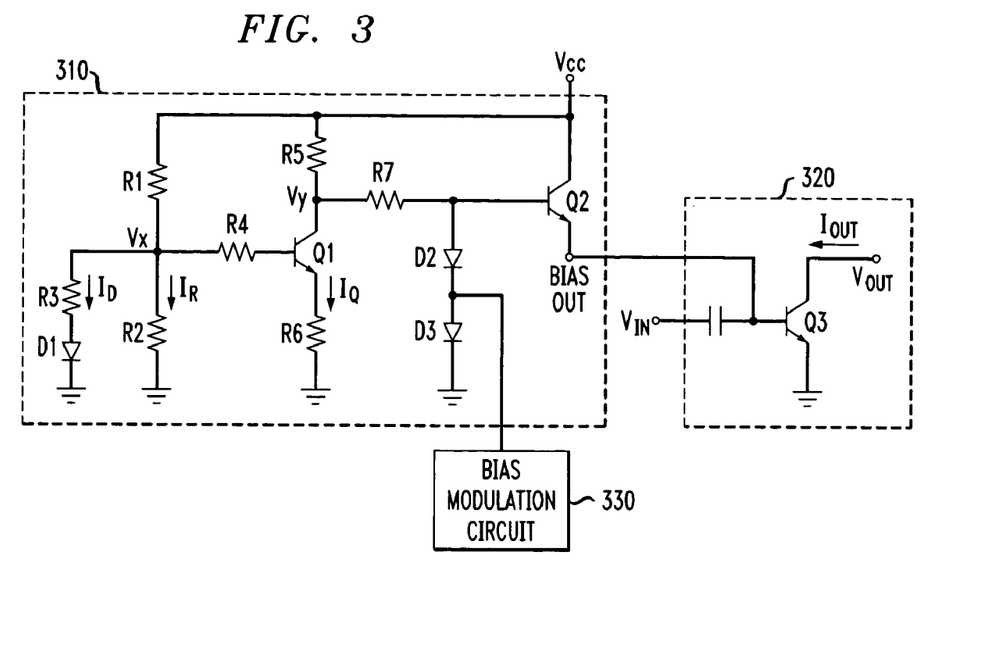
FIG. 3 is a schematic diagram of a power-voltage insensitive bias circuit in accordance with an illustrative embodiment.

FIG. 3 is a schematic diagram of an exemplary embodiment of a power-voltage insensitive bias circuit 310. As shown in FIG. 3, the power-voltage insensitive bias circuit 310 includes a first resistor R1 connected between a power voltage node Vcc and a voltage divider node Vx, a second resistor R2 connected between a ground node and the voltage divider node Vx, a first bipolar transistor Q1, a fourth resistor R4 connected between the base of the first transistor Q1 and the voltage divider node, a fifth resistor R5 connected between the collector of the first transistor Q1 and the power voltage node, a sixth resistor R6 connected between the first emitter and the ground node, a second bipolar transistor Q2 with its collector connected to the power voltage node, a seventh resistor R7 connected between the collector of transistor Q1 and the base of transistor Q2, and a second diode D2 and third diode D3 (both forward biased during operation) connected in series between the base of transistor Q2 and the ground node.

Note that in various embodiments where temperature compensation is desired, a thermal compensation circuit consisting of a first diode D1 in series with a third resistor R3 can be added between the first voltage divider node Vx and the ground node. Note that the first diode D1 is arranged to be forward biased during normal operation, i.e., when a positive voltage of sufficient magnitude is applied to the power supply node Vcc.

In normal operation, the bias circuit 310 can provide a stable bias output current to a power amplifier 320 or any number of other circuits regardless of large voltage fluctuations in the power supply node Vcc. For the present example of FIG. 3, the emitter of transistor Q2 can provide a constant bias current to the base of transistor Q3, thus enabling transistor Q3 to amplify any signal presented to node Vin in a stable fashion.

Note that during normal operation, the voltage of the voltage divider node Vx can be determined by resistors R1 and R2 (assuming no thermal compensation) or by resistors R1, R2, R3 and diode D1 (assuming thermal compensation). Also note that fluctuations in the power supply node Vcc can cause proportional changes in the voltage divider node Vx. For example, as Vcc increases, Vx may also increase causing an increase in both the base-emitter current and the collector-emitter current $I_Q$ of the first transistor Q1. The increase of the collector-emitter current $I_Q$ can cause the voltage Vy at the collector of transistor Q1 to decrease.

Now note that a rise in Vcc will also tend to cause the voltage at node Vy to rise given that node Vy is coupled to Vcc both through resistor R5 and through resistor R6 via transistor Q2. By carefully selecting the resistance values/ratios of resistors R4, R5 and R6, the relationship between the slope of voltage Vy vs. Vcc can be establish to be positive, negative or substantially flat. By selecting the resistance values/ratios of resistors R4, R5 and R6 to assure a flat voltage Vy slope, a stable output current at the emitter of transistor Q2 may be assured regardless of variations in Vcc.

Further, when diode D1 and resistor R3 are added for thermal compensation, temperature-induced variations to the first transistor Q1 that might affect the bias output current can be compensated. For example, a drop in temperature can cause the base-emitter voltage $V_{BE}$ of the first transistor Q1 to rise, which unchecked would cause a lowering of the collector-emitter current $I_Q$, a rise in Vy and a lowering of the output bias current at the emitter of the second transistor Q2. However, the same temperature drop causing an increase in the base-emitter $V_{BE}$ voltage of the first transistor Q1 can also cause an increase in the forward-bias voltage of the first diode D1. This increase in the forward-bias voltage of diode D1 can cause Vx to rise, and when the resistive values of resistors R1, R2 and R3 are appropriately chosen, the increase in Vx can be made to track the increase in the base-emitter $V_{BE}$ voltage of the first transistor Q1. As a result, the collector-emitter current $I_Q$, voltage Vy and the bias current at the emitter of the second transistor Q2 can remain constant over temperature.

Returning to FIG. 3, it should be noted that the (optional) bias modulation circuit 330 may be coupled between diodes D2 and D3. By activating the bias modulation circuit 330, the output bias current can be substantially altered to a lower level for situations where power conservation is desired. While the form of the bias modulation circuit 330 may vary substantially from embodiment to embodiment, FIGS. 7A-7F are provided as practical examples of circuits capable of appropriately changing the output bias current level of the second transistor Q2.

Figure 4:
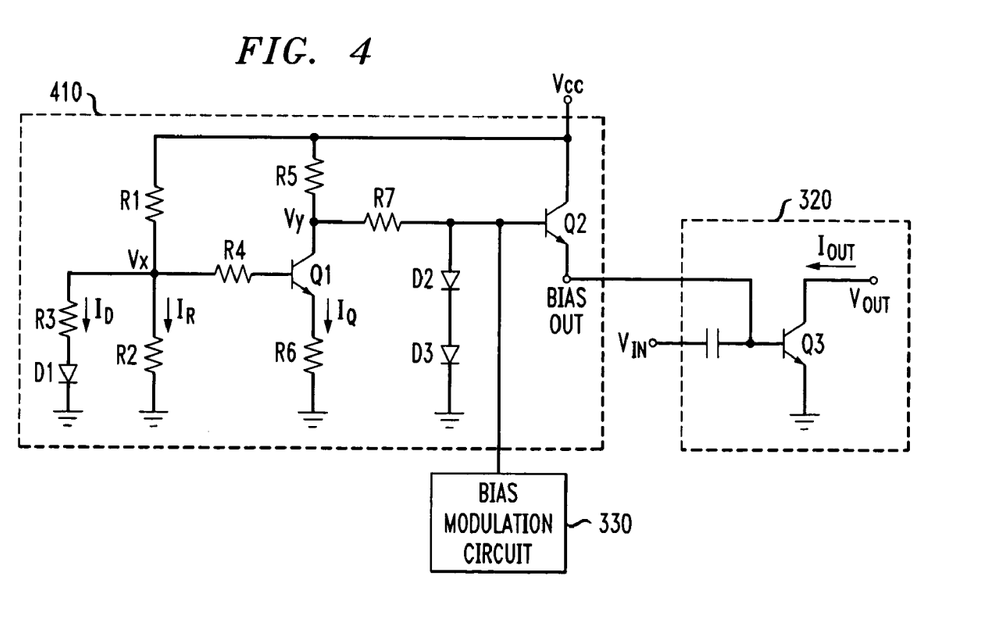
FIG. 4 is a schematic diagram of a power-voltage insensitive bias circuit in accordance with an illustrative embodiment.

FIG. 4 is a schematic diagram of another exemplary embodiment of a second power-voltage insensitive bias circuit 410. As shown in FIG. 4, the configuration of the second power-voltage insensitive bias circuit 410 can be essentially the same as the same lines as the power-voltage insensitive bias circuit 310 of FIG. 3 and therefore operate along the same general principles. However, unlike the power-voltage insensitive bias circuit 310 of FIG. 3, the present power-voltage insensitive bias circuit 410 is coupled to the (optional) bias modulation circuit 330 at the base of the second transistor Q2, rather than between diodes D2 and D3.

Notably the bias circuits described herein as power voltage insensitive circuit may also function to provide temperature compensation as well. That is, the diode circuit, comprised of diode D1 in series with resistor R3, is not the only solution for temperature compensation. The diode circuit is useful for temperature optimization when more compensation is required over temperature. As such, this function of the diode circuit function is applicable to many embodiments described herein.

Figure 5:
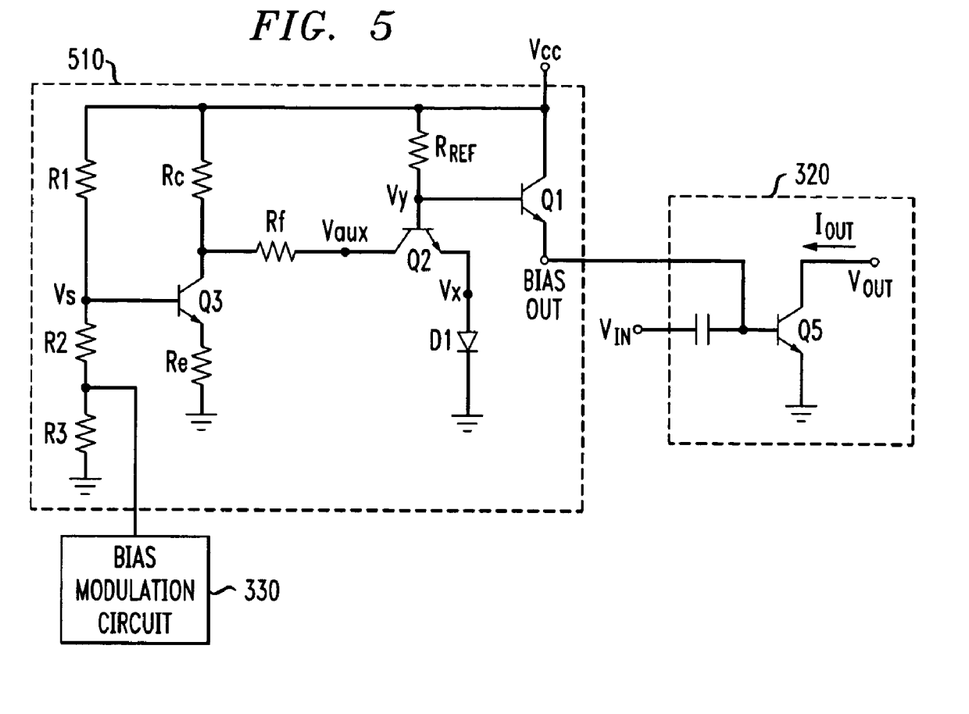
FIG. 5 is a schematic diagram of a power-voltage insensitive bias circuit in accordance with an illustrative embodiment.

FIG. 5 is a schematic diagram of yet another exemplary embodiment of a power-voltage insensitive bias circuit 510. As shown in FIG. 5, the power-voltage insensitive bias circuit 510 includes a first bipolar transistor Q1 having its base is connected to a first reference node Vy, its collector connected to a power voltage node Vcc and its emitter providing a current bias output to a power amplifier 320 or other circuit. As with the previous examples, the current bias output is appreciably insensitive to voltage fluctuations of the voltage power node Vcc. Continuing with FIG. 5, the power-voltage insensitive bias circuit 510 also includes a reference resistor Rref connected between the power voltage node Vcc and the first reference node Vy, and a second bipolar transistor Q2 with its base connected to the first reference node Vy, its emitter coupled to a ground node via a first diode D1 and its collector coupled to the collector of a third transistor Q3 via resistor Rf. Note that transistor Q2 can act as a transistor or the equivalent of two diodes (base-emitter & base-collector).

Continuing, the emitter of transistor Q3 can be coupled to ground via resistor Re, and the collector of transistor Q3 can be coupled to the power voltage node Vcc via a resistor Rc. A first resistor R1 can connected between the power voltage node Vcc and a voltage divider node Vs, and a second resistor (optionally consisting of resistive elements R2 and R3) can be connected between the ground node and the voltage divider node Vs. Note that the base of the third transistor Q3 also can be connected to the voltage divider node Vs.

In normal operation, the voltage at the voltage divider node Vs can be dependent on the power supply node Vcc. As Vcc rises, the voltage at node Vs can increase, thus causing transistor Q3 to draw more current. As transistor Q3 draws an increasing amount of current, this current can be drawn from a first path that includes resistor Rref, across the collector-base junction of transistor Q2, resistor Rf, across the collector and emitter of transistor Q3 and resistor Re. This increase in current through the base-collector junction of the second transistor Q2 will tend to lower the voltage at node Vy as the voltage increase at Vcc tries to raise it. The effect is that the voltage at node Vy can remain flat in response to a voltage increase of the power supply node Vcc assuming an appropriate choice of resistor values. Accordingly, node Vy can be "compensated", and the output bias current can remain stable.

Also note that, as Vcc lowers, the voltage at Vs can decrease, and transistor Q3 may draw less current. As Q3 draws less current, current will tend to flow along a second path that includes resistor Rc, resistor Rf, across the collector and emitter of transistor Q2 and diode D1. This will tend to increase the voltage at node Vy as the voltage decrease at Vcc tries to lower it. The effect is that the voltage at node Vy can remain flat in response to a voltage decrease of the power supply node Vcc. Again, node Vy is "compensated" and the output bias current can remain stable assuming an appropriate choice of resistor values.

Again returning to FIG. 5, note that the bias modulation circuit 330 is connected between resistive elements R2 and R3. As with the previous examples of FIGS. 3-4, the exact form of the bias modulation circuit 330 can vary greatly while noting that the bias modulation circuits of FIGS. 7A-7F are well-suited examples of capable bias modulation circuits.

Figure 6A:
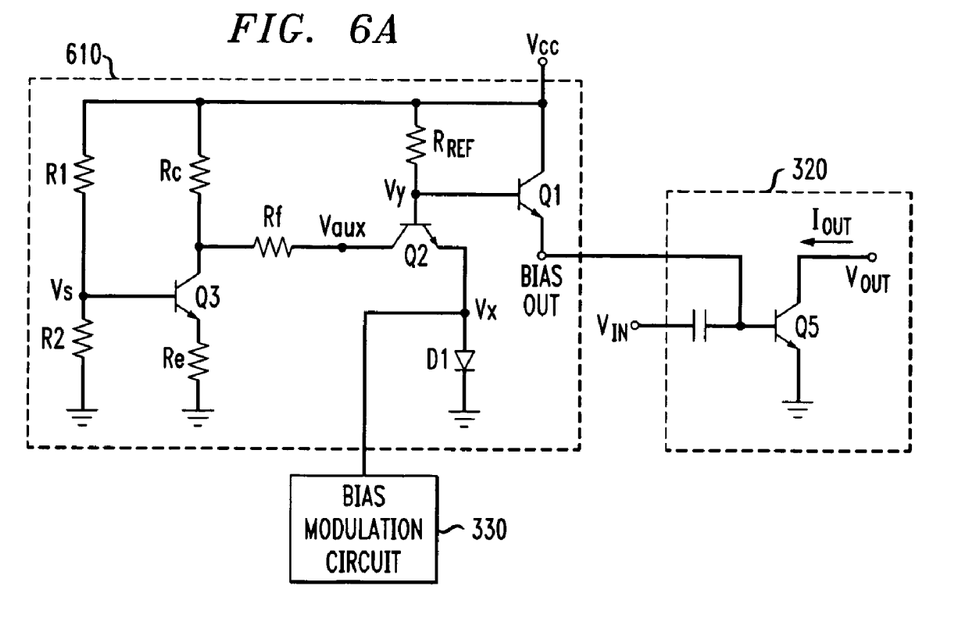
FIG. 6A is a schematic diagram of a power-voltage insensitive bias circuit in accordance with an illustrative embodiment.

FIG. 6A is a schematic diagram of still another exemplary embodiment of a power-voltage insensitive bias circuit 610. As shown in FIG. 6A, the configuration of the present power-voltage insensitive bias circuit 610 can be essentially the same as the power-voltage insensitive bias circuit 510 of FIG. 5 and therefore can operate along the same general principles. However, unlike the power-voltage insensitive bias circuit 510 of FIG. 5, the present power-voltage insensitive bias circuit 610 is coupled to the (optional) bias modulation circuit 330 at the emitter of the second transistor Q2 rather than between resistive elements R2 and R3.

Figure 6B:
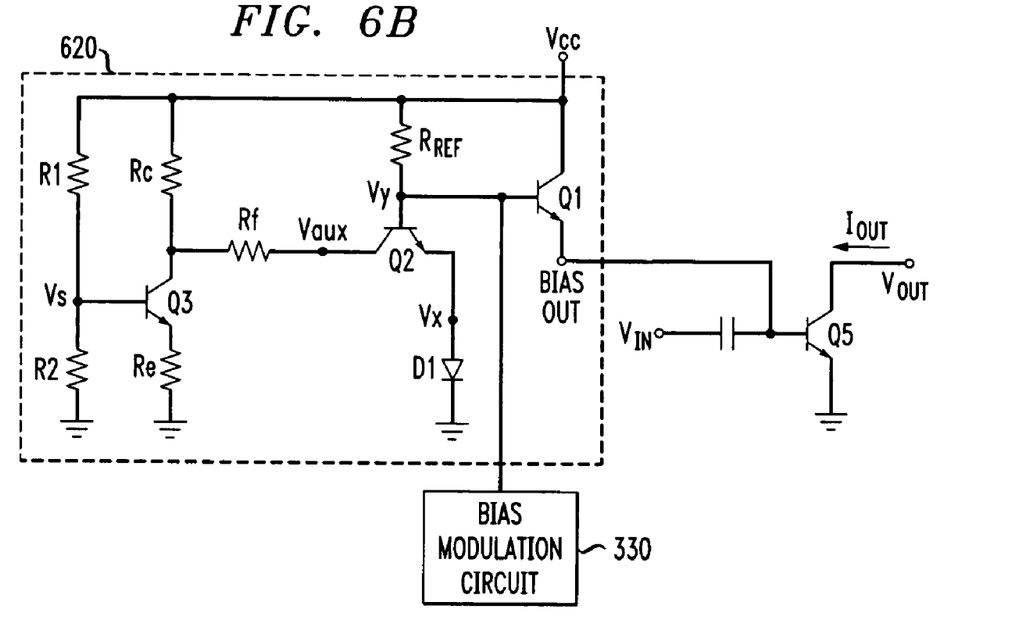
FIG. 6B is a schematic diagram of a power-voltage insensitive bias circuit in accordance with an illustrative embodiment.
Figure 7A:
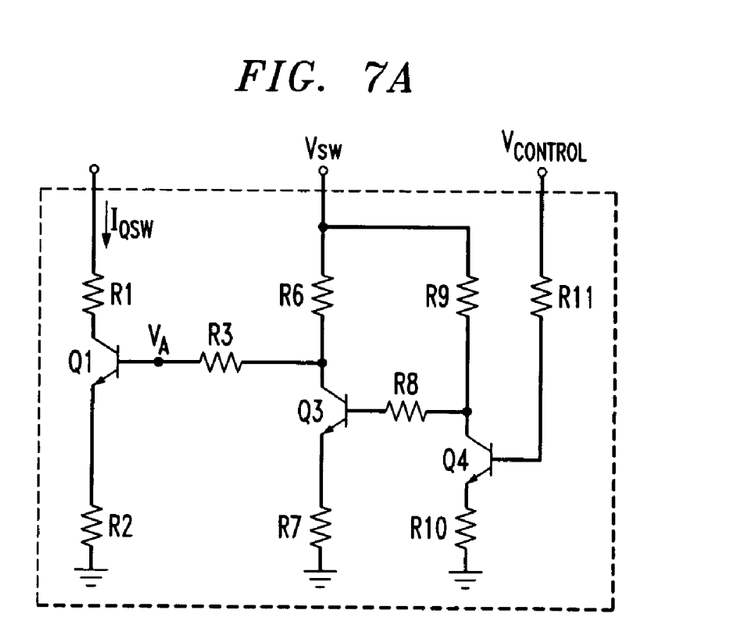
FIGS. 7A-7F are schematic diagrams of various bias modulation circuits for optional use with the power-voltage insensitive bias circuits of FIGS. 3-6.
Figure 7B:
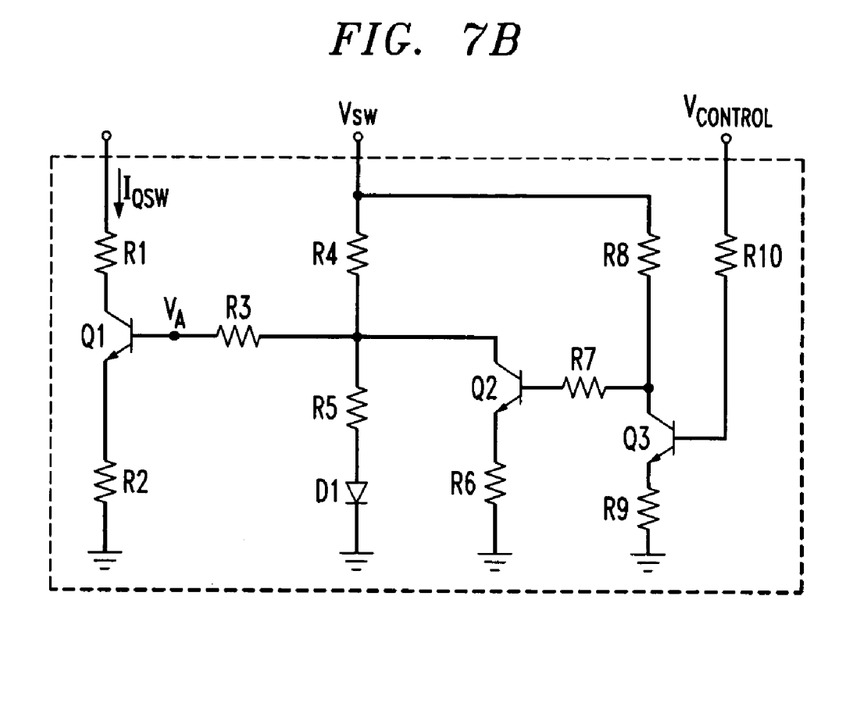
Figure 7C:
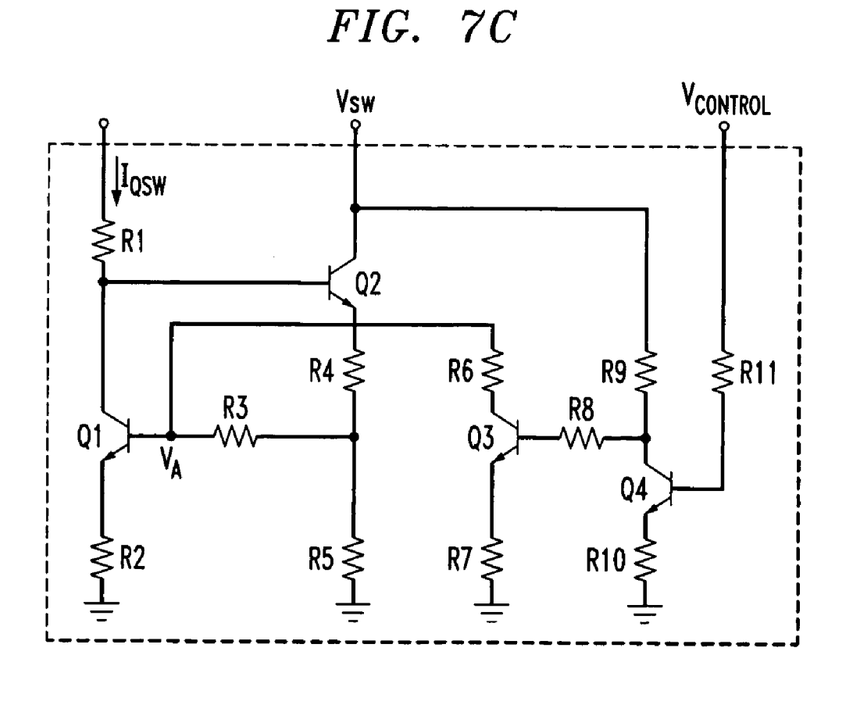
Figure 7D:
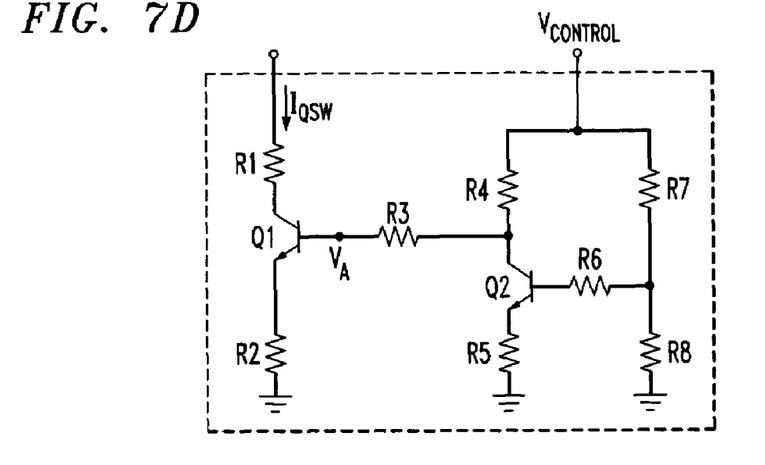
Figure 7E:
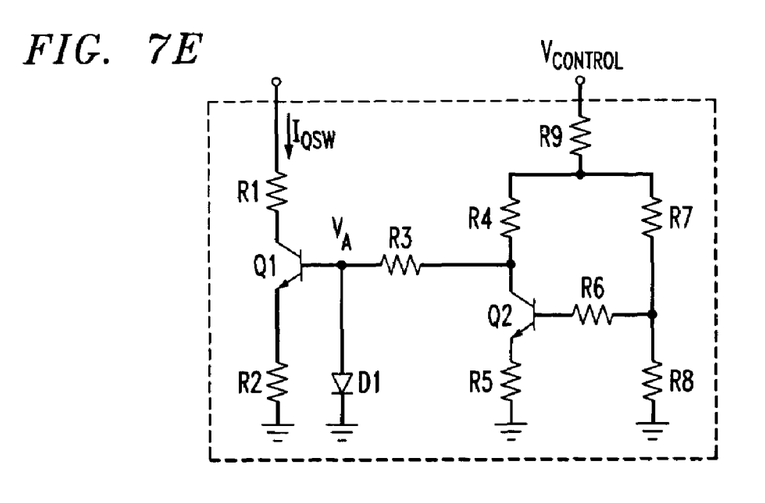
Figure 7F:
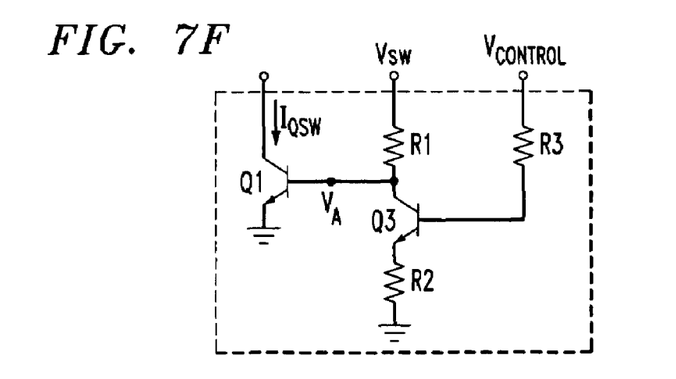

FIG. 6B is a schematic diagram of still another exemplary embodiment of a power-voltage insensitive bias circuit 620. As shown in FIG. 6B, the configuration of the present power-voltage insensitive bias circuit 620 can be essentially the same as the power-voltage insensitive bias circuit 510 of FIG. 5 and therefore can operate along the same general principles. However, unlike the power-voltage insensitive bias circuit 510 of FIG. 5, the present power-voltage insensitive bias circuit 620 is coupled to the (optional) bias modulation circuit 330 at the base of the first transistor Q1 rather than between resistive elements R2 and R3.

In connection with illustrative embodiments, voltage-insensitive bias circuits are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A voltage-insensitive bias circuit, comprising:
a first resistor connected between a power voltage node and a voltage divider node;
a second resistor connected between a ground node and the voltage divider node;
a first bipolar transistor having a first base, a first collector and a first emitter;
a fourth resistor connected between the first base and the voltage divider node;
a fifth resistor connected between the first collector and the power voltage node;
a sixth resistor connected between the first emitter and the ground node;
a second bipolar transistor having a second base, a second collector and a second emitter, wherein the second collector is connected to the power voltage node;
a seventh resistor connected between the first collector and the second base; and
a second diode having a second anode and a second cathode, and a third diode having a third anode and a third cathode, wherein the second anode is connected to the second base, the second cathode is connected to the third anode, and the third cathode is connected to the ground node;
wherein the second emitter provides a first bias output to a second circuit, the first bias output being appreciably insensitive to voltage fluctuations of the voltage power node.

2. The voltage-insensitive bias circuit of claim 1, further comprising:
a thermal compensation circuit having a first end terminal and a second end terminal, the thermal compensation circuit including a first diode in series with a third resistor, wherein the first end terminal is connected to the voltage divider node, the second end terminal is connected to the ground node, and the first diode is arranged to be forward biased when a positive voltage is applied to the power voltage node.

3. The voltage-insensitive bias circuit of claim 2, wherein the second resistor and the third resistor have a ratio of resistive values that substantially optimizes thermal stability of the bias circuit.

4. The voltage-insensitive bias circuit of claim 2, wherein the voltage of the voltage divider node is determined by a first resistive value of the first resistor, a second resistive value of the second resistor, a third resistive value of the third resistor, a first base-emitter voltage of the first transistor and a first forward-bias voltage of the first diode.

5. The voltage-insensitive bias circuit of claim 4, wherein a temperature variation causing an increase in the first base-emitter voltage is substantially compensated by an increase of the voltage of the voltage divider node caused by a temperature-related increase in the first forward-bias voltage.

6. The voltage-insensitive bias circuit of claim 1, further comprising a bias modulation circuit having at least one transistor and a modulation control output, wherein the bias modulation circuit is adapted to adjust the first bias output.

7. The voltage-insensitive bias circuit of claim 6, wherein the modulation control output is connected to the third anode.

8. The voltage-insensitive bias circuit of claim 6, wherein the modulation control output is connected to the second base.

9. The voltage-insensitive bias circuit of claim 6, wherein a first slope of the first bias output as a function of the voltage of the power-voltage node is a function of a fourth resistive value of the fourth transistor, a fifth resistive value of the fifth transistor and a sixth resistive value of the sixth transistor.

10. The voltage-insensitive bias circuit of claim 6, wherein the fourth resistive value, the fifth resistive value and the sixth resistive value have values that cause the first slope to be substantially level for large voltage fluctuations of the power-voltage node.

11. The voltage-insensitive bias circuit of claim 1, further comprising a bias modulation means coupled to at least one of the second transistor and the second diode for adjusting the first bias output.

* * * * *